United States Patent
Moore et al.

(10) Patent No.: US 10,608,600 B2
(45) Date of Patent: Mar. 31, 2020

(54) ADAPTABLE RECEIVER AMPLIFIER

(71) Applicant: ANALOG DEVICES, INC., Norwood, MA (US)

(72) Inventors: Ralph D. Moore, Greensboro, NC (US); Jesse Bankman, Gibsonville, NC (US)

(73) Assignee: Analog Devices, Inc, Norwood, MA (US)

( * ) Notice: Subject to any disclaimer, the term of this patent is extended or adjusted under 35 U.S.C. 154(b) by 0 days.

(21) Appl. No.: 15/205,973

(22) Filed: Jul. 8, 2016

(65) Prior Publication Data
US 2017/0187339 A1    Jun. 29, 2017

Related U.S. Application Data

(60) Provisional application No. 62/387,349, filed on Dec. 23, 2015.

(51) Int. Cl.
| | |
|---|---|
| *H03F 1/14* | (2006.01) |
| *H03F 3/185* | (2006.01) |
| *H03F 3/45* | (2006.01) |
| *H03G 3/30* | (2006.01) |
| *H03G 1/00* | (2006.01) |

(52) U.S. Cl.
CPC ......... *H03F 3/185* (2013.01); *H03F 3/45183* (2013.01); *H03F 3/45201* (2013.01); *H03G 1/0088* (2013.01); *H03G 3/301* (2013.01); *H03F 2203/45288* (2013.01); *H03F 2203/45488* (2013.01); *H03F 2203/45506* (2013.01)

(58) Field of Classification Search
CPC ........ H03F 3/185; H03F 3/72; H03F 3/45183; H03F 2203/45288; H03G 3/301

USPC .................... 330/51, 98, 133, 286, 150, 310
See application file for complete search history.

(56) References Cited

U.S. PATENT DOCUMENTS

| | | | |
|---|---|---|---|
| 4,429,416 A | 1/1984 | Page | |
| 5,049,829 A | 9/1991 | Garskamp et al. | |
| 5,399,986 A | 3/1995 | Yen | |
| 5,880,631 A | 3/1999 | Sahota | |
| 6,967,531 B1 | 11/2005 | Seymour | |
| 7,173,485 B2 * | 2/2007 | Nagai | H03F 3/45197 330/107 |

(Continued)

FOREIGN PATENT DOCUMENTS

WO    WO 2008/088635    7/2008

OTHER PUBLICATIONS

International Search Report and Written Opinion, International Application No. PCT/US2016/064187 dated Mar. 19, 2017, 12 pages.

(Continued)

*Primary Examiner* — Khanh V Nguyen
*Assistant Examiner* — Khiem D Nguyen
(74) *Attorney, Agent, or Firm* — Knobbe, Martens, Olson & Bear, LLP

(57) ABSTRACT

Provided herein are apparatus and methods for a multi-stage signal-processing circuit. The signal-processing circuit can include multiple configurable stages that can be cascaded and configured to process an input signal. Control circuitry can be used to select an output of the configurable stages. Serial data can be recovered with good signal integrity using a signal monitor with the configurable stages by virtually placing the signal monitor on a buffered output node.

24 Claims, 10 Drawing Sheets

(56) References Cited

U.S. PATENT DOCUMENTS

| | | |
|---|---|---|
| 7,212,041 B2 | 5/2007 | Kazemi-Nia |
| 7,317,769 B2 | 1/2008 | Tonietto et al. |
| 7,443,237 B1 * | 10/2008 | Liu .................... H03F 3/45192 |
| | | 330/253 |
| 7,538,606 B2 * | 5/2009 | Ripley .................. H03F 3/4508 |
| | | 327/124 |
| 7,636,003 B2 | 12/2009 | Liu et al. |
| 7,652,539 B2 | 1/2010 | Gao et al. |
| 7,741,908 B2 * | 6/2010 | Furuta .................. H03F 3/45475 |
| | | 330/144 |
| 2002/0047744 A1 | 4/2002 | Ichihara |
| 2003/0218501 A1 | 11/2003 | Oshima et al. |
| 2005/0127993 A1 | 6/2005 | Yim et al. |
| 2009/0128239 A1 | 5/2009 | Kuijk et al. |
| 2010/0097087 A1 | 4/2010 | Hogeboom et al. |
| 2015/0249437 A1 | 9/2015 | Morishita et al. |

OTHER PUBLICATIONS

Datasheet, "AD8158 Quad Buffer Mux/Demux," Analog Devices, 2008 in 36 pages.
Datasheet, "AD8152 Asynchronous Digital Crosspoint Switch," Analog Devices, 2003 in 32 pages.
Datasheet, "ADN4612 Digital Crosspoint Switch," Analog Devices, 2013 in 76 pages.

\* cited by examiner

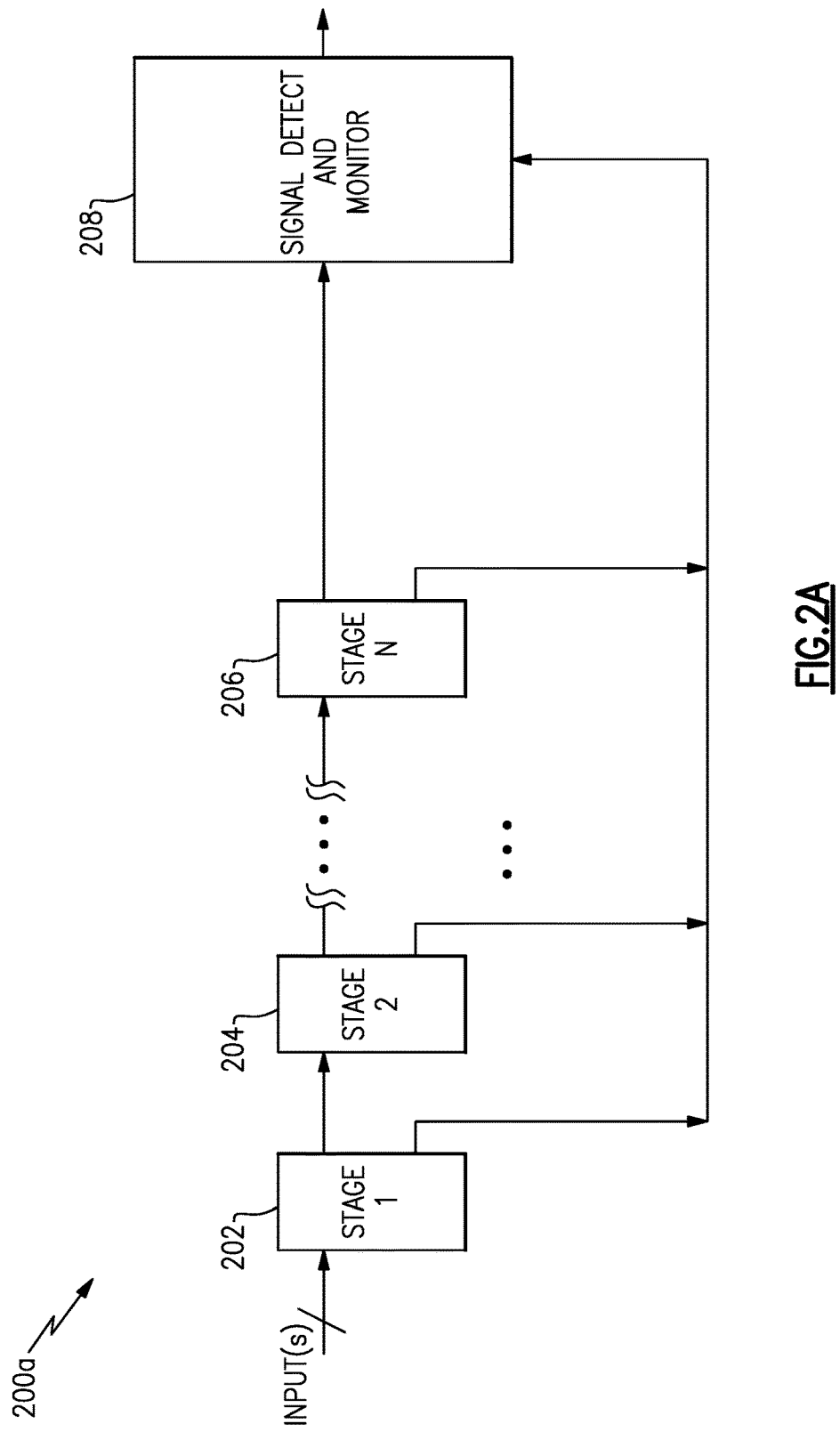

ADAPTABLE RECEIVER AMPLIFIER

CROSS-REFERENCE TO RELATED APPLICATIONS

The present application claims priority benefit to U.S. Provisional Application No. 62/387349, which is hereby incorporated herein by reference in its entirety.

BACKGROUND

Field

Embodiments of the invention relate to electronic circuits, and more particularly, to receivers and receiver signal-processing systems having configurable stages.

Description of the Related Technology

A serial data transmitter and receiver TX/RX is used to transmit data over a channel. In one application an eye diagram can be used at the receiver end of the channel to monitor the signal integrity. For instance, a probe can be connected to the amplifier and an eye diagram can be observed graphically on a personal computer (PC) monitor. The observed pattern can appear as an eye or eye diagram, and the amount of eye opening can reflect the integrity of the equalized data.

Personal computers and laptops can use a serial data transmitter and receiver TX/RX in communicating data across serial ports to and from computer peripheral components.

In some applications an equalizer and limiting amplifier can be used to improve a data signal arriving at the receiver RX. The limiting amplifier can be used to compensate for losses and attenuation within the signal chain preceding the amplifier input.

SUMMARY

In one aspect, a signal-processing apparatus comprises a plurality of cascaded stages and a selection circuit. Each stage is configured to process an input signal, and a stage output of a first stage is coupled to an input of a second stage. The selection circuit is configured to output an output of a selected stage of the plurality of cascaded stages.

The selected stage can correspond to any one of the plurality of cascaded stages based at least in part on a control command. An output from each of the plurality of cascaded stages other than the selected stage can be a high impedance output. Each of the plurality of stages can comprise two outputs, and at least one of the two outputs for each stage can be a high impedance output.

Also, the output of the first stage can be a first output, and the first stage can include a second output. At least one of the first output or the second output of the first stage can be a high impedance output. The second output of the first stage can be coupled to a common bus with outputs from other stages of the plurality of cascaded stages; and the second output of the first stage can be coupled to the selection circuit.

The output of the selected stage can be a second output, and a first output of the selected stage can be a high impedance output. The second output can be coupled to at least one of the selection circuit or a common bus with outputs from other stages of the plurality of cascaded stages. The first output can be coupled to at least one of an input of a proximate stage or a signal monitor.

The selected stage can be in a stage monitor state and at least one unselected stage can be in a stage blocking state. The selected stage can be in a stage monitor state and one or more stages in a signal path preceding the selected stage can be in a stage cascade state. Also, one or more stages in a signal path following the selected stage can be in a stage blocking state. In the stage blocking state, an output of the one or more stages in the signal path following the selected stage can be a high impedance output.

Each of the plurality of stages can comprise a first output and a second output. The first output of each of the plurality of cascaded stages can be coupled to at least one of an input of a proximate stage or a signal monitor; and the second output of each of the plurality of cascaded stages can be coupled to at least one of a common bus or a selection circuit. The first stage can comprise an input stage, an amplifier stage, and a transconductance stage. The amplifier stage can be coupled to the first output, and the transconductance stage can be coupled to the second output and have an input coupled to the input stage.

The transconductance stage can be configured to receive a voltage from the amplifier stage and the second output outputs a current. The transconductance stage can also be configured to operate in either a transconductance on state or a transconductance off state. In the transconductance off state, the second output can be a high impedance output.

The transconductance stage can comprise a cascode circuit and a transconductance device. In the transconductance off state the cascode circuit can be coupled to a voltage low source, and in the transconductance on state the cascode circuit can be coupled to a voltage high source. Also, the transconductance device can be coupled to a current source.

The amplifier stage can be configured to operate in either a stage on state or a stage off state. In the stage off state the first output can be a high impedance output. The amplifier stage can comprise a cascode circuit and a transconductance device. In the stage off state the cascode circuit can be coupled to a voltage low source. In the stage on state the cascode circuit can be coupled to a voltage high source, and the transconductance device can be coupled to a current source.

The signal-processing apparatus can further comprise a current input port and a voltage output port. The current input port can be electrically coupled to an output of the transconductance stage of each of the plurality of stages. The voltage output port can be configured to provide a voltage output signal.

In another aspect a stage of a limiting amplifier comprises an input stage, a first stage output, a second stage output, an amplifier stage, and a transconductance stage. The amplifier stage is coupled to the input stage and the first stage output. The transconductance stage is coupled to the input stage and to the second stage output. The stage is configured to operate in a plurality of states based at least in part on a state of at least one of the amplifier stage or the transconductance stage.

The transconductance stage can be configured to operate in either a transconductance on state or a transconductance off state. In the transconductance off state the second output can be a high impedance output.

The transconductance stage can comprise a cascode circuit and a transconductance device. In the transconductance off state the cascode circuit can be coupled to a voltage low source. In the transconductance on state the cascode circuit can be coupled to a voltage high source; and the transconductance device can be coupled to a current source.

The amplifier stage can be configured to operate in either a stage on state or a stage off state. In the stage off state the first stage output can be a high impedance output. The amplifier stage can comprise a cascode circuit and a transconductance device. In the stage off state the cascode circuit can be coupled to a voltage low source. In the stage on state the cascode can be coupled to a voltage high source; and the transconductance device can be coupled to a current source.

Also, the amplifier stage can be configured to operate in either a stage on state or a stage off state. In the stage off state the first stage output is a high impedance output.

In another aspect a signal-processing apparatus comprises a plurality of cascaded stages and a selection circuit. Each stage is configured to process an input signal. A stage voltage output of a first stage is coupled to an input of a second stage. A stage transconductance output of the first stage is coupled to a common bus. The selection circuit is coupled to the common bus and configured to output an output of a selected stage of the plurality of cascaded stages.

The first stage can be the selected stage. When the first stage is the selected stage, the stage voltage output of the first stage can be a high impedance output. When the first stage is not the selected stage, the stage transconductance output can be in a transconductance off state and an output of the stage transconductance output can be a high impedance output.

BRIEF DESCRIPTION OF THE DRAWINGS

These drawings and the associated description herein are provided to illustrate specific embodiments of the invention and are not intended to be limiting.

FIG. 2A is a schematic diagram of a data receiver system with multiple signal-processing stages according to an embodiment.

DETAILED DESCRIPTION OF EMBODIMENTS

Figure 1:
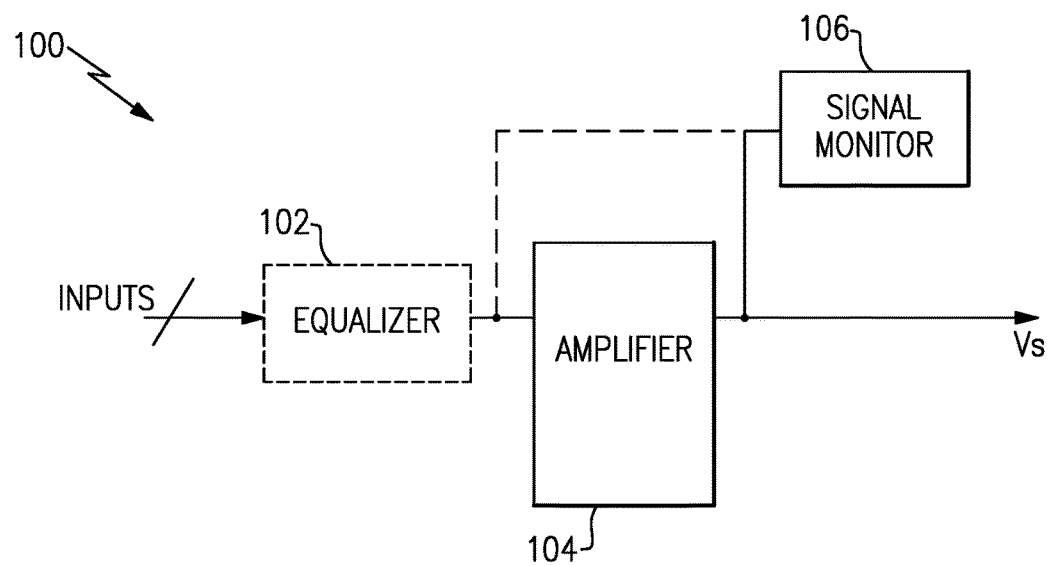
FIG. 1 is a schematic diagram of a data receiver system in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

In a serial data system, the direct transmission and reception of a binary signal can be used to avoid modulation or quantized data conversion. One method to compensate for high frequency signal loss in a transmission line is a passive equalizer (EQ). The passive EQ does not consume power; however, in balancing the signal amplitude over a frequency band, it can attenuate the lower frequency portion of the received signal. The goal of the receiver RX is to recover the transmitted signal from the transmitter TX for all frequencies of interest. This can become a more challenging task as data rates, and hence bandwidths, increase.

Eye diagrams are commonly used to evaluate the integrity of a received data signal. An eye diagram shows parametric information about a signal including jitter and distortion content, and data signals of high integrity present an open eye. Therefore, it can be useful to include an eye monitor within a receiver system to measure the received data signal. For instance, a data signal at the output of an equalizer, as described above would ideally have constant amplitude as a function of frequency and provide an open eye. From the eye diagram information, the equalizer can be conveniently calibrated and adjusted until an eye opening meets a system criterion or specification.

As data rates increase, the transmission losses within the transmission medium can become significant, causing a binary transmitter and receiver (TX/RX) system to become unwieldy. In order to compensate for channel losses and equalizer attenuation, one approach can be to arbitrarily increase the TX output level by an amount proportional to the attenuation in the channel. Unfortunately this approach is incongruous with present and future trends in device scaling which necessitate lower voltage swings. An alternative approach can be to use an amplifier in the RX path to amplify the equalizer output to a level which effectively captures the signal data. Unfortunately, this approach by itself can lead to unnecessarily high power dissipation. Therefore, there is a need for a balanced approach which uses a moderate signal from the TX path but also provides some gain in the RX channel. Because the required amount of amplification (gain) can depend in part upon the bandwidth and frequency, there is a need for signal-processing stages which are configurable. A configurable stage can be adjusted according to the physical characteristics of signals from the equalizer.

For instance a configurable stage can be used to provide adaptable gain to a limiting amplifier. As discussed above, an eye diagram can be used to monitor a data signal within the RX path (channel) and to determine signal integrity. In this way signals from the limiting amplifier can be monitored and a gain or characteristic of the limiting amplifier can be adjusted accordingly.

Unfortunately integrating eye diagram monitors within the stages of a signal-processing path, such as a path of a limiting amplifier system, can become area consuming and can unnecessarily load or perturb the output signals by presenting significant impedance such as interconnect capacitance. Accordingly, there is a need for signal-processing systems, including but not limited to limiting amplifiers, in an RX path which allow for monitoring a signal without significantly loading or affecting the behavior of the system.

Apparatus and methods for an adaptable receiver system are presented herein. An RX limiting amplifier, signal-processing system, or receiver with configurable stages can amplify or process data signals. Using a current to voltage converter to virtually observe an output signal from each stage, the signal-processing system can be virtually monitored with one eye monitor. Advantageously, the eye monitor can virtually monitor stages without loading the output of each stage. By monitoring the stages in succession, the number of stages can be selected and programmed based on the frequency and power requirements. Thus, the receiver can allow for a programmable and configurable design. Further, the stages are configurable and can be used and ported to multiple platforms and can be used in high speed serial data reception applications.

FIG. 1 is a schematic diagram of an embodiment of a data receiver system 100 in accordance with the teachings herein. In the illustrated embodiment, the data receiver system 100 includes an amplifier 104, a signal monitor 106, and an equalizer 102 (shown in dashed lines). However, it will be understood that the data receiver system 100 can include fewer or more components as desired. For example, in certain embodiments, the data receiver system 100 may include only one or any combination of amplifier 104, a signal monitor 106, and an equalizer 102. As another example, the data receiver system 100 can include two or more equalizers and/or a flip-flop, etc. The data receiver system 100 can receive input signals INPUTS and provide an amplified output signal Vs. The amplifier 104 can include an amplifier input and an amplifier output. The equalizer 102 can receive the input signals INPUTS and provide an equalized output to the amplifier input. The equalized output can have a relatively constant gain as a function of frequency. Alternatively, the input signals INPUTS can be applied directly to the amplifier input without the use of the equalizer 102. In this case the amplifier can receive data signals of variable amplitude as a function of frequency.

The amplifier 104 can be a limiting amplifier of an RX receiver in a serial data transmitter and receiver TX/RX system. Additionally the amplifier 104 can have programmable gain so as to be adaptable to the amplitude or power level of the input signals INPUTS. As shown in FIG. 1, the signal monitor 106 can include an input port connected to the amplifier output to monitor the amplified output signal Vs. The signal monitor 106 can have a signal port communicatively coupled to the amplifier output and can present a small capacitance or loading at the amplifier output. Also as shown in FIG. 1, the connection between the amplifier 104 and the signal monitor 106 can be virtually moved, as represented by the dashed wire. The virtual movement can be accomplished by a circuit or system approach which allows the signal monitor 106 to observe characteristics of data at the amplifier input. In some cases, the circuit can provide the virtual movement without loading (and/or avoiding, reducing, minimizing the load on) the amplifier input with capacitance or impedance. Additionally, the connection can be virtually moved to internal nodes within the amplifier 104 so as to monitor signals of intermediate signal strength between the amplifier input and the amplifier output; and the virtual movement can again be accomplished by a circuit or system approach which does not perturb (and/or avoids, reduces, or minimizes the perturbation of) the internal nodes with probe capacitance or impedance.

Information from the signal monitor 106 can be used to adjust the gain of the amplifier 102 to a target level for amplifying the input signals INPUTS so that an output signal Vs has a desired characteristic. The output signal Vs can be a voltage signal Vs, and an eye diagram from the signal monitor 106 can be used to adjust the gain. The gain can be adjusted until an eye opening, as observed on an eye diagram, becomes wide enough for data reconstruction. In this way the gain can be adjusted to a level which can be less than a maximum full power gain while providing adequate signal strength. Thus, the amplifier can operate at power levels lower than the maximum for an overall power savings.

Although the data receiver system 100 shows a configuration where the output signal is provided as Vs, other configurations including additional output components are possible. For instance, the data receiver system can include a clocked D-type flip flop (DFF) to receive the output signal Vs at a D input of the clocked DFF and to provide a clocked data signal at a Q output of the clocked DFF. A clock signal can be used to clock data of the output (voltage) signal Vs to the Q output of the clocked DFF. Also, the amplifier 104 can be a generalized amplifier and have signal-processing receiver stages, also referred to as stages or configurable stages, which can provide gain and/or equalization to the input signals INPUTS.

FIG. 2A is a schematic diagram of a data receiver system 200a with multiple signal-processing stages according to one embodiment. In the illustrated embodiment, the data receiver system 200a has a signal detect and monitor circuit 208 which can augment the signal-processing stages to monitor characteristics, such as an eye opening, of output data signals. However, it will be understood that the data receiver system 200a can include fewer or more components as desired. For example, in some embodiments, the data receiver system 200a can include only one or any combination of the signal detect and monitor circuit 208 and amplifier 104.

In the illustrated embodiment, the data receiver system 200a includes a first stage 202, a second stage 204, and an Nth stage 206 connected in cascade. Each stage can be a signal-processing stage such as an amplifier and/or an equalizer; and it will be understood that any number of stages can be included as desired.

The first stage 202 has an input port and a first output port connected to an input port of the second stage 204. The second stage 204 has an input port and a first output port connected to an input port of the successive stage. As shown by the ellipses in FIG. 2A, successive stages can be cascaded in a similar manner from the second stage 204 to the Nth stage 206 which has an input port connected to a first output port of its preceding stage. The Nth stage 206 also has a first output port which is connected to a first chain input port of the signal detect and monitor circuit 208. As a note, because the stages are connected in cascade or in succession, the Nth stage can also be referred to as the last stage or the final stage.

The first stage 202 receives the data input signals INPUT(s) at the first stage input port and processes the input signals INPUT(s) to provide a first cascade output signal at the first output port. The first cascade output signal is provided to the input port of the second stage 204 and processing can occur. As a non-limiting example, each successive stage can provide additional gain and/or equalization along the signal path between the input port of the first stage 202 and the first output port of the Nth stage 206. For instance, the second stage 204 can be configured to provide additional gain and/or equalization to the first cascade output signal to provide a second cascade output signal. The second cascade output signal is provided at the first output port of the second stage 204. The second cascade output signal can be further processed by successive stages until the Nth stage is reached. Also, the Nth stage can process a cascade output signal from the preceding stage so as to provide an Nth cascade output signal. In some embodiments, the Nth stage can omit the Nth cascade output signal and corresponding port.

Also as shown in FIG. 2A, the first through Nth stages 202-206 can each have a second output port. The second output port of the first stage 202, the second stage 204, and the Nth stage 206 are shown to be connected together to a multiplexed monitor input port of the signal detect and monitor circuit 208. The common connection of the second output ports to the multiplexed monitor input port allows for virtual multiplexing or virtual movement of the connection between the amplifier 104 and the signal detect and monitor 208. For example, in some embodiments, only one of the first through Nth stages 202-206 provides an active output signal to the common connection, while the remaining stages from the first through Nth stages 202-206 can operate as high impedance nodes. As will be further illustrated in the following figures, the selection of a stage from the first through Nth stage 202-206 to provide the active output signal can be used to program the gain. Thus, in the illustrated embodiment, the gain of the signal-processing stages can be programmed by multiplexing the outputs from the various stages.

The signal and detect monitor circuit 208 can be used to monitor one or more characteristics of signals of the multi-stage limiting amplifier. In FIG. 2A the signal detect and monitor circuit 208 is shown to receive the Nth cascade output signal at the first chain input port and the active output signal at the multiplexed monitor input port. The signal detect and monitor circuit 208 can provide the output signal at an output port. The output signal can have programmed gain based in part on an eye diagram.

The signal detect and monitor circuit 208 can be used in adjusting gain of the multi-stage limiting amplifier to provide a selectable gain. For instance, control or programmable enable signals (not shown) can be applied to the first through Nth stages 202-206 to test or compare an eye diagram opening based on which stage from the first through Nth stages 202-206 actively provides the active output signal. One or more control or enable signals (not shown) can first enable the first stage 202 to provide the active output signal from the second output port of the first stage 202. If a resulting eye diagram is sufficiently open so that the first stage 202 provides satisfactory gain to the data signals INPUT(s), then the first stage 202 can become the stage selected to provide the active output signal. However, if the eye diagram is not sufficiently open or if the signal detect and monitor circuit 208 determines that the active output signal requires more gain, then the second stage 204 can be enabled to provide the active output signal from the second output port of the second stage 204. The active output signal received from the second output port of the second stage 204 can have more gain than the active output signal received from the first output port of the first stage 202.

If the above mentioned criteria are met for the second stage 204, then the second stage 204 can be selected to provide the active output signal; and if the criteria are not met using the second stage 204, then the programmed enable sequence can continue successively for each cascaded stage until either one or more signal criteria, such as an eye diagram opening characteristic, is met, or until the last or Nth stage 206 in the cascade is reached. In some embodiments, when a stage prior to the Nth stage 206 meets the criterion, then a power savings can be achieved by not activating one or more unselected stages, stages following the selected stage, and/or by only using the required number of stages to meet the eye opening characteristic.

Although the signal and detect monitor circuit 208 shows a configuration where the signal detect and monitor circuit 208 receives the common connection signal and only the Nth cascade output signal at the first chain input port, other configurations are possible, the signal and detect monitor circuit 208 can have additional inputs connecting to any one or an combination of the stages 202-206. In general, the signal and detect monitor circuit 208 can have more than one chain input port to receive more than one cascade output signal from the first through Nth cascade output signals. For instance, the signal and detect monitor 208 can have a first through Nth chain input port to receive the first through Nth cascade output signals, respectively. In addition, in some cases, the signal detect and monitor circuit 208 may not receive any inputs from the stages 202-206 directly and/or may only receive an input from the common connection or common bus.

Also, although the data receiver system 200a shows an amplifier with a first, second, and Nth stage 202-206, other configurations having greater or fewer stages are possible. For instance an amplifier having two stages connected in cascade can be implemented with just the first stage 202 and the second stage 204. Additionally, while not shown in FIG. 2A, the data input signals INPUT(s) can also be multiplexed with the first through Nth cascade output signals. In this way the signal detect and monitor circuit can also determine if the data input signals INPUT(s) have sufficient strength or are sufficiently equalized to meet an eye opening or signal characteristic. When the input signals INPUT(s) already satisfy an eye opening criterion, then the signal-processing stages can be optionally operated in a low power mode.

Furthermore, it will be understood that other amplifier configurations are possible. For instance, a signal detect and monitor circuit 208 can be used with a multi-stage audio amplifier or a multi-stage low drop-out regulator (LDO) which can also benefit from having configurable stages.

Figure 2B:
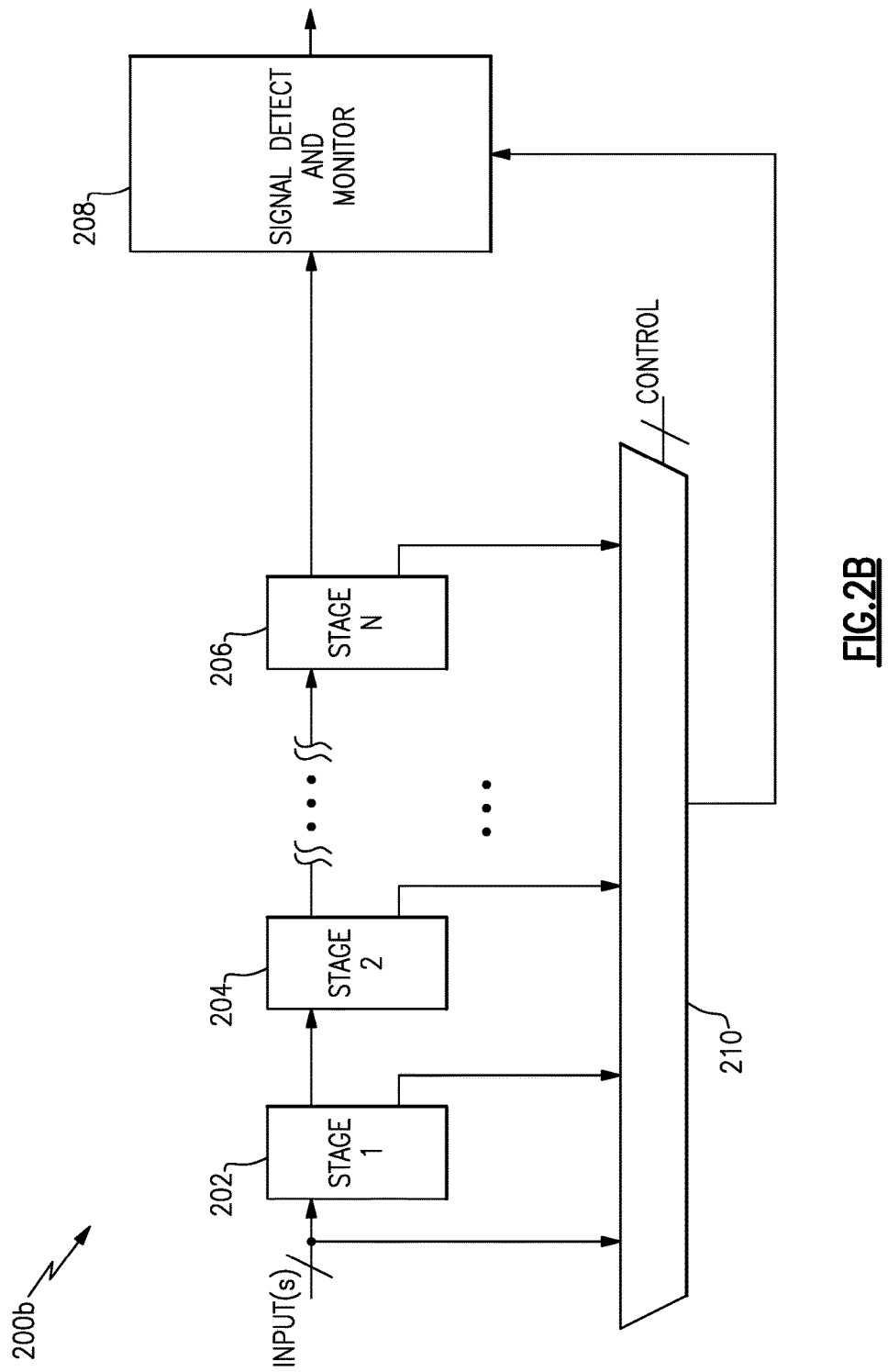
FIG. 2B is a schematic diagram of a data receiver system with multiple signal-processing stages according to an embodiment.

FIG. 2B is a schematic diagram of a data receiver system 200b with multiple signal-processing stages according to an embodiment. The data receiver system 200b is similar to that of the data receiver system 200a except that a multiplexer 210 is also shown. The multiplexer 210 can include a first input coupled to the input port of the first stage 202, a second input coupled to the second output port of the first stage 202, a third input coupled to the second output port of the second stage 204, and an (N+1)th input coupled to the second output port of the Nth stage 206. In this way the multiplexer 210 can include an input for each of the stages 202, 204, 206. Also, the multiplexer 210 can include an output which can provide the active output signal as described above with reference to FIG. 2A. In some embodiments the second output for each stage can output a signal and in certain embodiments, unselected stages can be in a high impedance state as described in greater detail above with reference to FIG. 2A.

Control signals, CONTROL, can be provided to select which stage from the first through Nth stages 202-206 provides the active output signal; or alternatively, the control signals, CONTROL, can be provided to operate the first through Nth stages 202-206 in a high impedance state while selecting the INPUT(s) without amplification to bypass the stages.

Figure 2C:
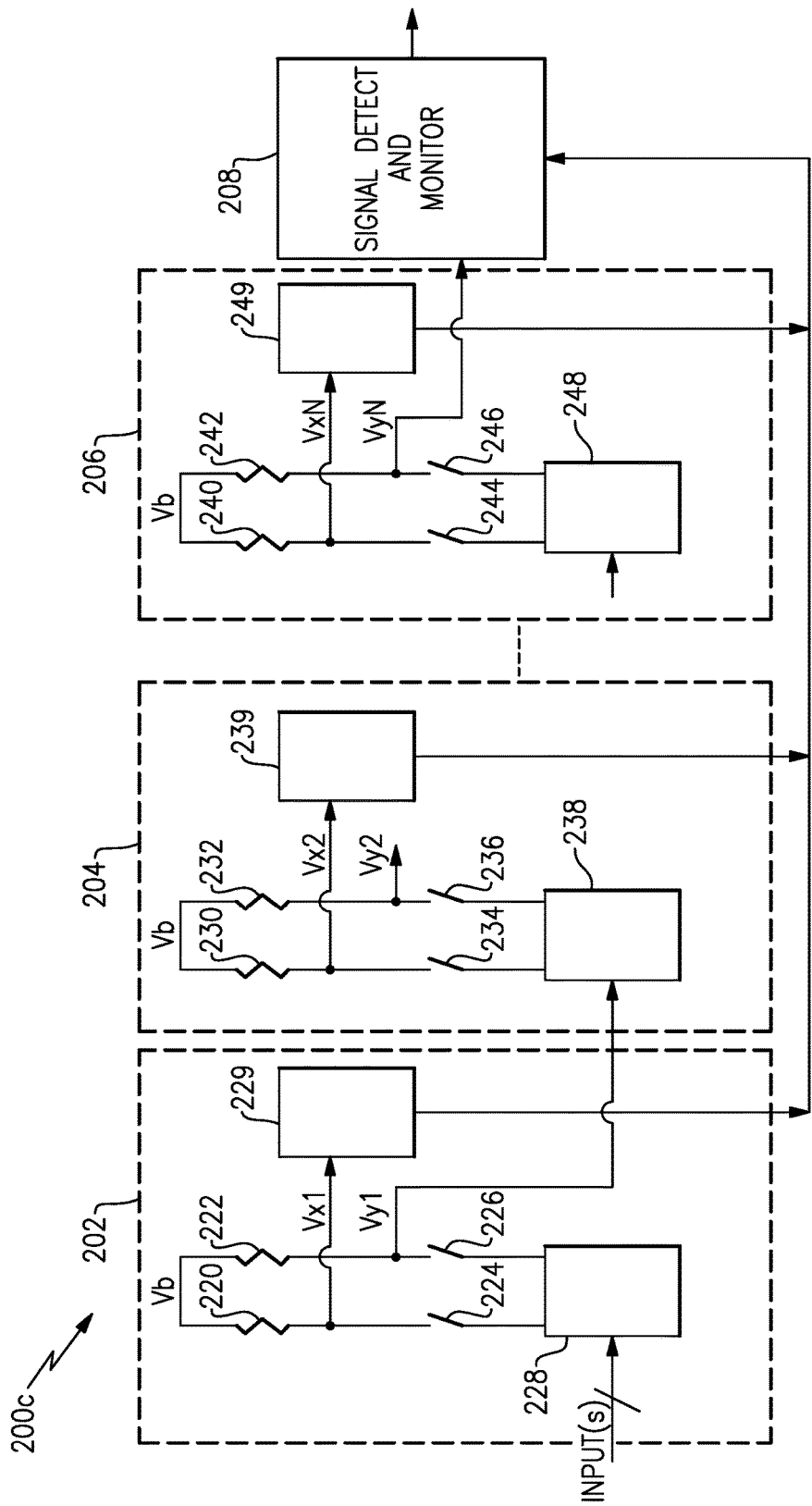
FIG. 2C is a schematic diagram of a data receiver system with multiple signal-processing stages according to an embodiment.

FIG. 2C is a schematic diagram of a data receiver system 200c with multiple signal-processing stages 202, 204, 206 according to an embodiment. The data receiver system 200c is similar to the data receiver system 200a of FIG. 2A. In the illustrated embodiment, the first stage 202 includes an input stage 228, a switch 224, a switch 226, a resistor 220, a resistor 222, and an output stage 229. The switch 224 is connected between a first terminal of the resistor 220 and a first output node of the input stage 228. The switch 226 is connected between a first terminal of the resistor 222 and a second output node of the input stage. The second nodes of the resistors 220 and 222 are connected to a fixed bias node Vb. The first terminal of the resistor 220 is connected to an input port of the output stage 229. An input node of the input stage 228 is the input port of the first stage 202. The first terminal of the resistor 222 is the first output port of the first stage 202, and an output node of the output stage 229 is the second output port of the first stage 202.

The second stage 204 includes an input stage 238, a switch 234, a switch 236, a resistor 230, a resistor 232, and an output stage 239. The switch 234 is connected between a first terminal of the resistor 230 and a first output node of the input stage 238. The switch 236 is connected between a first terminal of the resistor 232 and a second output node of the input stage. The second nodes of the resistors 230 and 232 are connected to the fixed bias node Vb. The first terminal of the resistor 230 is connected to an input port of the output stage 239. An input node of the input stage 238 is the input port of the second stage 204. The first terminal of the resistor 232 is the first output port of the second stage 204, and an output node of the output stage 239 is the second output port of the second stage 204.

The third stage 206 includes an input stage 248, a switch 244, a switch 246, a resistor 240, a resistor 242, and an output stage 249. The switch 244 is connected between a first terminal of the resistor 240 and a first output node of the input stage 248. The switch 246 is connected between a first terminal of the resistor 242 and a second output node of the input stage. The second nodes of the resistors 240 and 242 are connected to the fixed bias node Vb. The first terminal of the resistor 240 is connected to an input port of the output stage 249. An input node of the input stage 248 is the input port of the Nth stage 206. The first terminal of the resistor 242 is the first output port of the Nth stage 206, and an output node of the output stage 249 is the second output port of the Nth stage 206.

As described above with respect to FIG. 2A, the data input signals INPUT(s) are received by the first stage 202 and the signal detect and monitor 208 can monitor signals of the multiple signal-processing stages to provide signal processing to the output signal. Description of the signal flow and operation of the receiver system 200c can be similar to that of the receiver system 200a. Furthermore, in some embodiments, the receiver system 200a can operate to provide programmable gain and to multiplex the active output signal as described in greater detail below.

Comparisons can be drawn between the receiver system 200a of FIG. 2A and the receiver system 200c. With respect to the first stage 202, the input stage 228 receives the input data signals INPUT(s). By comparison to the receiver system 200a, the first stage 202 operates such that a signal Vy1 at the first terminal of the resistor 222 is the first cascade output signal. Also by comparison the second stage 204 operates such that a signal Vy2 at the first terminal of the resistor 232 is the second cascade output signal; and the Nth stage 206 operates such that a signal VyN at the first terminal of the resistor 242 is the Nth cascade output signal.

In some embodiments, programmable gain and virtual multiplexing can be achieved through the control of the switches 224, 226, 234, 236, 244, and 246. With respect to the first stage 204, the operation of the input stage 228 can depend upon operation states of the switch 224 and the switch 226. A stage monitor state can be defined where the switch 224 is closed, to operate as a short circuit or low impedance, and the switch 226 is open, to operate as a high impedance or open circuit. In the stage monitor state the input stage 228 amplifies the data input INPUT(s) to provide a signal Vx1 to the input node of the output stage 229. The output stage 229 can further amplify, buffer, or convert the signal Vx1 to provide the active output signal to the output node of the output stage 229. In this way the second output node of the first stage 202 provides the active output signal during the stage monitor state. Also, in the stage monitor state, the first cascade output signal Vy1 can be an AC (alternating current) ground and no signal (a null signal) can pass from the first output node of the first stage 202 to the input node of the second stage 204.

A stage cascade state can be defined where the switch 224 is open and the switch 226 is closed. In the stage cascade state, the input stage 228 can amplify the data INPUT(s) to provide the signal Vy1, the first cascade output signal, so that the first cascade output signal can be applied to the input of the second stage 204. Also, in the stage cascade state, the signal Vx1 can become an AC ground providing no signal to the input node of the output stage 229. When no signal appears at the input node of the output stage 229, the output node of the output stage 229 can operate as a high impedance. In this way the second output node of the first stage 202 can operate as a high impedance node during the stage cascade state.

A stage blocking state can also be defined where both the switch 224 and the switch 226 are open. In the stage blocking state both the signal Vx1 and Vy2 can be AC ground so that the first output node provides a null cascade output signal (Vy1) and so that the second output node provides a high impedance. In this context, providing high impedance can also mean the switches 224 and 226 are open circuit. An open circuit can represent a high DC impedance by breaking a path of current flow.

A similar analysis can be applied to each stage from the second to the Nth stage 204-206 of the cascade. A stage monitor state, a stage cascade state, and a stage blocking state can be defined for each stage with reference to the corresponding switches 234, 236, 244, and 246 and with respect to the corresponding signals Vx2, Vy2, VxN, and VyN. Instead of receiving INPUT(s), the successive stages receive the cascade output signals from a preceding stage. For instance, the second stage 204 receives the cascade output signal Vy1 from the first stage 202 at the input port of the input stage 238. By and large, the description of the operational behavior of each stage from the second to the Nth stage 204-206 can be similar to the description of the operational behavior of the first stage 202 as discussed above.

In the illustrated embodiment, the multiplexed monitor input port of the signal detect and monitor circuit 208 is connected to the second output ports of each of the stages 202-206 and can be used to monitor and observe the behavior of the multi-stage amplifier by programming or by sequencing the different switch states as defined above. For instance, the first stage 202 can first be programmed by control or enable signals (not shown) to operate in the stage monitor state while the second through Nth stages 204-206 can be programmed to operate in the stage blocking state. In this way the first stage 202 provides the active output signal while the remaining stages 204-206 operate with high impedance. Under these conditions the gain of the input stage 228 and the output stage 229 contribute to a total monitored gain.

Next, the first stage 202 can be programmed to operate in the stage cascade state while the second stage 204 is programmed to operate in the stage monitor state. Successive stages from the second stage 204 through the Nth stage 206 can be programmed to operate in the stage blocking state. In this way the second output node of the second stage 204 can provide the active output signal while the second output nodes of the first stage 202 and the successive stages through the Nth stage 206 operate with high impedance and/or can be powered off. Under these conditions the active output signal is associated with a gain determined by a gain of the first stage 202 cascaded with a gain of the input stage 238 and the output stage 239.

The total monitored gain can be tested against a criterion for each of the first through Nth stages 202-206. For instance, when the active output signal at the multiplexed monitor input port of the signal detect and monitor circuit 208 causes an eye diagram to meet an eye opening criterion, then the control signals can select the stage associated with the passing criterion. When the stage associated with the passing criterion is less than the maximum number of stages, N, then some of the stages can operate in a low quiescent state or powered off state for reduced power consumption. For instance, if it is determined that when the second stage is controlled to operate in the stage monitor state, the eye diagram is open and meets specification, then the control signals can be set to operate the first stage 202 in the stage cascade state, the second stage 204 in the stage monitor state, and the successive stages through the Nth stage 206 in the blocking state. Having some stages operating in the stage blocking state can advantageously reduce quiescent and power consumption.

While the data receiver system 200c of FIG. 2C shows the second output ports of the first through Nth stages as being connected to the multiplexed monitor input port of the signal detect and monitor circuit 208, other configurations are possible. For instance, as described with reference to FIGS. 2A and 2B, the multiplexed monitor input port can also receive the data input signals INPUT(s) at the multiplexed monitor input port. In this way the signal detect and monitor can also test INPUT(s) directly. For instance, the first through Nth stage 202-206 can be controlled to operate in the blocking state while the INPUT(s) are multiplexed to the multiplexed monitor input port of the signal detect and monitor circuit 208. If the signal detect and monitor circuit 208 shows the INPUT(s), without amplification, meet the an eye diagram opening criterion, then the INPUT(s) can be directly used as the amplifier output, while the first through Nth stages 202-206 are controlled to operate in the blocking state.

Figure 3A:
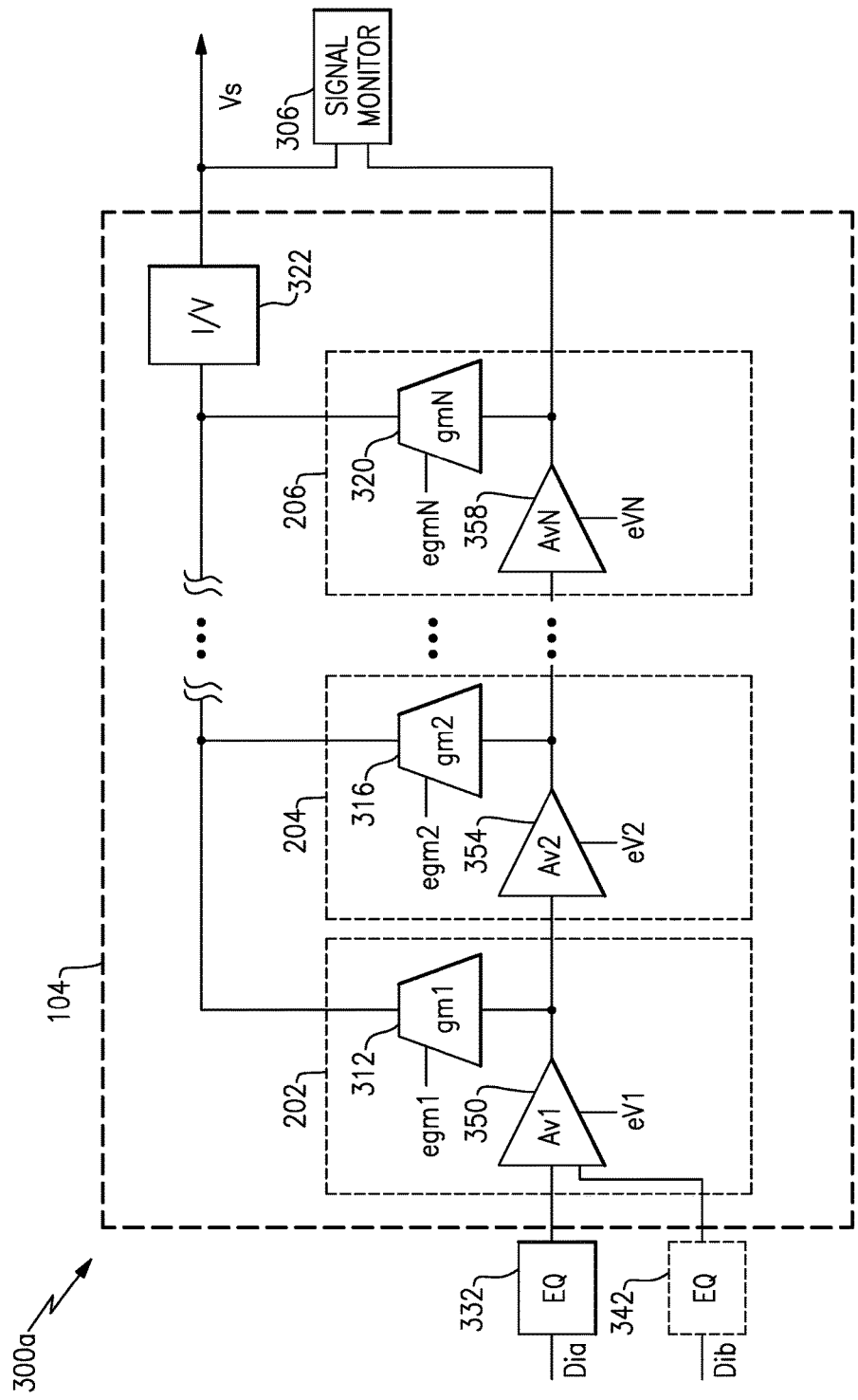
FIG. 3A is a detailed schematic diagram of a data receiver system with configurable multiple signal-processing stages according to an embodiment.

FIG. 3A is a detailed schematic diagram of a data receiver system 300a with configurable multiple signal-processing stages 202, 204, 206 according to one embodiment. The data receiver system 300a also includes an equalizer (EQ) 332, an EQ 342, and a signal monitor 306. Similar to the signal monitor 106 of FIG. 1, the signal monitor 306 can be used to monitor an eye diagram. Also, it will be understood that the data receiver system 300a can include fewer or more components as desired. For example, in some embodiments, the data receiver system 300a can include only one or any combination of stages, the equalizers 332, 342, and the signal monitor 306. In the illustrated embodiment, the amplifier 104 includes configurable multiple signal-processing stages and a current to voltage (I/V) converter 322; the multiple signal-processing stages include a first stage 202, a second stage 204, and an Nth stage 206 arranged in a cascade connection.

In the illustrated embodiment, the first stage 202 includes an amplifier stage 350 and a transconductance stage 312. The amplifier stage 350 can include a control terminal, a first input port, a second input port, and an output port connected to an input port of the transconductance stage 312. The transconductance stage 312 additionally can include a control terminal. In the illustrated embodiment, the second stage 204 includes an amplifier stage 354 and a transconductance stage 316. The amplifier stage 354 can include a control terminal, a first input port and an output port connected to an input port of the transconductance stage 316. The transconductance stage 316 also can include a control terminal. In the illustrated embodiment, the Nth stage 206 can include an amplifier stage 358 and a transconductance stage 320. The amplifier stage 358 can include a control terminal, a first input port and an output port connected to an input port of the transconductance stage 320. Also, the transconductance stage 320 can include a control terminal.

The equalizer 332 can include an input port and an output port connected to the first input of the amplifier stage 350. The equalizer 342 can include an input port and an output port connected to the second input of the amplifier stage 350. By comparison to the first stage 202 of FIGS. 2A-2C, the output port of the amplifier 350 is the first output port of the first stage 202 while an output port of the transconductance stage 312 is the second output port of the first stage 202. Also, the output port of the amplifier stage 354 can be the first output port of the second stage 204 while an output port of the transconductance stage 316 can be the second output port of the second stage 204. Additionally, the output port of the amplifier stage 358 is the first output port of the Nth stage 206 while an output port of the transconductance stage 320 is the second output port of the Nth stage 206.

Similar to multi-stage limiting amplifiers of the data receiver systems 200a-200c of FIGS. 2A-2C, the first through Nth stages 202-206 can be connected in cascade with multiple stages as implied by the ellipses. Also, as shown in FIG. 3A, the second output ports of the first through Nth stages 202-206 connect together to share a common current bus connecting to an input port of the I/V converter 322, and an output port of the I/V converter 322 connects to an input port of the signal monitor 306.

As shown in FIG. 3A, the data receiver system 300a can receive data input signals Dia and/or data input signals Dib. The data input signals Dia are received at the input port of the EQ 332, and the data input signals Dib are received at the input port of the EQ 342. The EQ 332 and the EQ 342 can equalize the data input signals Dia and Dib, respectively, to have constant gain as a function of frequency. The amplifier 104 can provide programmable gain to equalized data signals provided at the output ports of the EQ 332 and the EQ 342, and select control signals (not shown) can control the amplifier 350 to amplify equalized data signals provided at the output port of the EQ 332 or the output port of the EQ 342.

The first through Nth stages 202-206 are shown to also have enable signals. In the first stage 202 the control terminal of the amplifier stage 350 receives an enable signal eV1 and the control terminal of the transconductance stage 312 receives an enable signal egml. The enable signals eV1 and egml can be applied so as to operate the stage 202 in either the stage monitor state, the stage cascade state, or the stage blocking state as introduced in the description of FIG. 2C. In the stage monitor state the enable signal eV1 controls the amplifier stage 350 to provide the first cascade output signal as a voltage signal to the input port of the transconductance stage 312; and the enable signal egml controls the transconductance stage 312 to provide the active output signal by converting the voltage signal to a current signal which is received at the input port of the I/V converter 322. In the stage cascade state, the enable signal eV1 controls the amplifier stage 350 to provide the first cascade output signal as a voltage signal to the input port of the next stage; and the enable signal egml controls the transconductance stage 312 to operate with a high impedance output so as to not load the input port of the I/V converter 322. In the stage blocking state, the enable signal eV1 controls the amplifier stage 350 to provide a null cascade output signal and the transconductance stage 312 to operate as a high impedance node; in the stage blocking state the first stage 202 does not pass the cascade output signal nor the active output signal.

Control and operation of the successive stages including the $2^{nd}$ stage 204 through the Nth stage 206 with the enable signals eV2, egm2, eVN, and egmN is similar to the control and operation of the first stage 202 with the enable signals eV1 and egml. Also, the description of operation of the receiver system 300a is similar to that of the receiver systems 200a-200c. However, unlike the receiver systems 200a-200c, the receiver system 300a uses the I/V converter 322 to converter the active output signal. The active output signal is a current signal from one of the transconductance stages 312, 316 or 320 as described above, and the I/V converter 322 can convert the current signal to the voltage signal Vs. The voltage signal Vs is monitored by the signal monitor 306.

Advantageously, the eye monitor is communicatively coupled to the low impedance output node of the I/V converter 322; therefore, it does not load the first though Nth stage 202-206 with a parasitic impedance or probe capacitance. By having the enable signals eV1-eVN and egml-egmN, the total gain of the amplifier 104 can be programmed by selectively changing which of the first through Nth stage 202-206 provides the active output signal. And in this way, the first through Nth stages are virtually tested or monitored to determine which combination of enable signals eV1-eVN and egml-egmN provide the output signal Vs having an open eye diagram. Also, as described above, this can allow some of the stages to operate in a stage blocking state which can be a low power dissipation (power off) or low quiescent state.

Figure 3B:
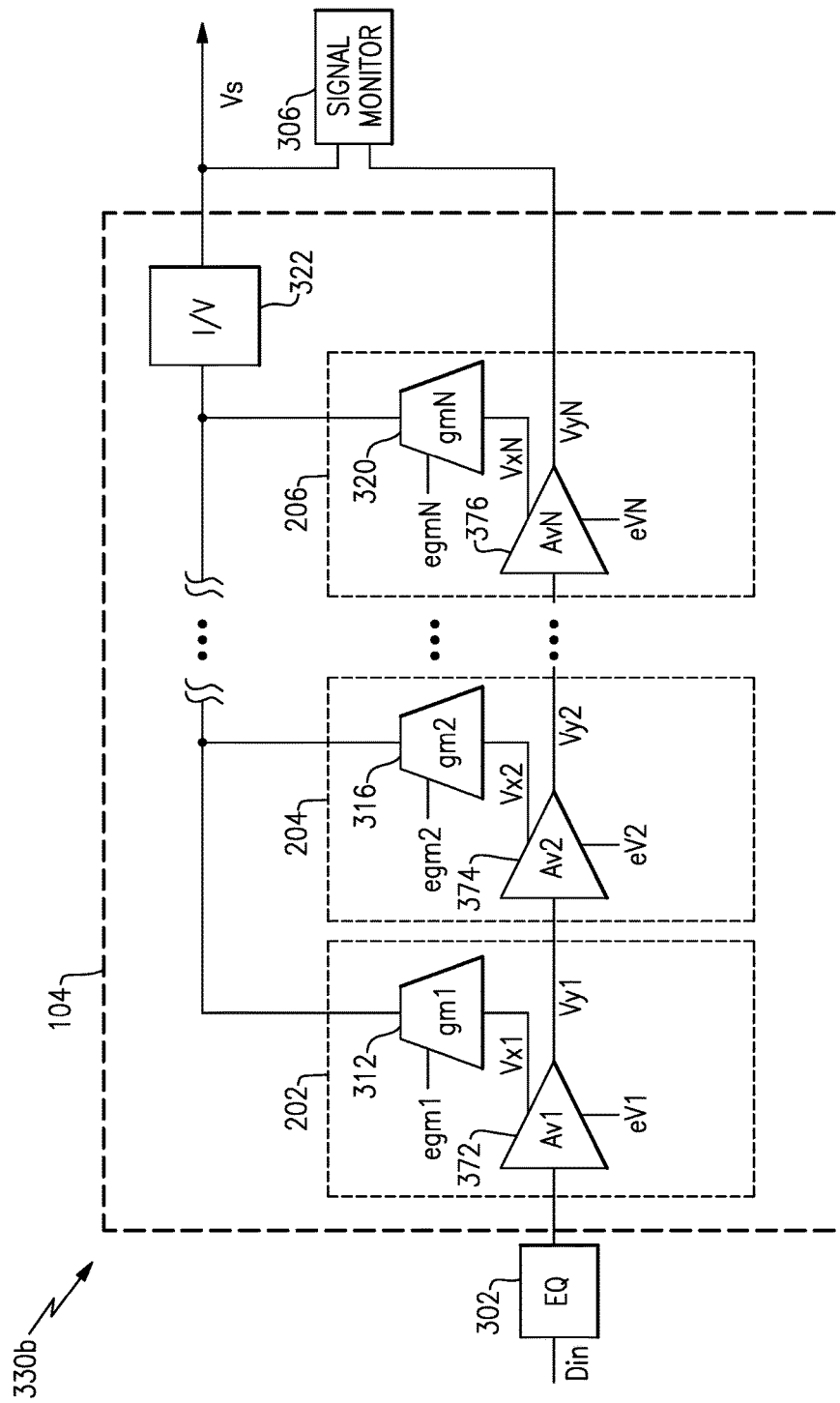
FIG. 3B is a detailed schematic diagram of a data receiver system with configurable multiple signal-processing stages according to an embodiment.

FIG. 3B is a detailed schematic diagram of a data receiver system 300b with configurable signal-processing stages according to another embodiment. The data receiver system 300b is similar to the data receiver system 300a. Furthermore, the system 300b shows a realization having only a single input port receiving an output data signal from the EQ 302. The EQ 302 receives the data input signals Din and the operation of the description of the connections and operation of the first through Nth stages 202-206 is similar to the description of the connections and operation of the first through Nth stages 202-206 of FIG. 3A; however, the first through Nth stages 202-206 within the multi-stage amplifier 300b are shown to have a modified signal flow topology.

In the first through Nth stages 202-206 of FIG. 3B, the amplifier stages and transconductance stages have an additional port connection. For instance in the first stage 202, an amplifier stage 372 is shown to have a single input port and to have a first amplifier output port and a second amplifier output port. The first amplifier output port of the amplifier 372 is connected to the input port of the transconductance amplifier 312, and the second amplifier output port of the amplifier 372 is connected to the input port of the second stage 204. In this way the amplifier 372 of the first stage 202 of FIG. 3B is connected with a different signal flow topology than the amplifier stage 350 illustrated in FIG. 3A.

The signal flow of the cascade output signal and the active output signal of the first stage 202 is separated. The enable signal eV1 can control a signal Vx1 and Vy1 to be independent signals as previously discussed in the description of operation of the first stage 202 of FIG. 2C. The cascade output signal follows a path provided from the first output port of the amplifier 372. The enable signal eV1 can control the amplifier 372 to provide the signal Vx1 to the input port of the transconductance stage and to provide null signal at the second amplifier output port when the stage 202 operates in the stage monitor state. Alternatively, the enable signal eV1 can control the amplifier 372 to provide the signal Vy1 to the input port of the second stage 204 and to provide a null signal at the first amplifier output port when the first stage 202 operates in the stage cascade state. Finally, the enable signal eV1 can control the amplifier 372 to provide null signals at both the first and second amplifier output nodes during the stage blocking state.

Description of the signal flow in the successive stages including the second through Nth stages 204-206 can be similar to that described above. The second stage 204 includes an amplifier 374 with a first and second amplifier output node providing a signal Vx2 and Vy2; and the final stage, the Nth stage 206, is shown to have an amplifier 376 with only a first and second amplifier output node providing a signal VxN and VyN. The second amplifier output port provides an output signal VyN for connecting to a second input port of the signal monitor 306.

Figure 3C:
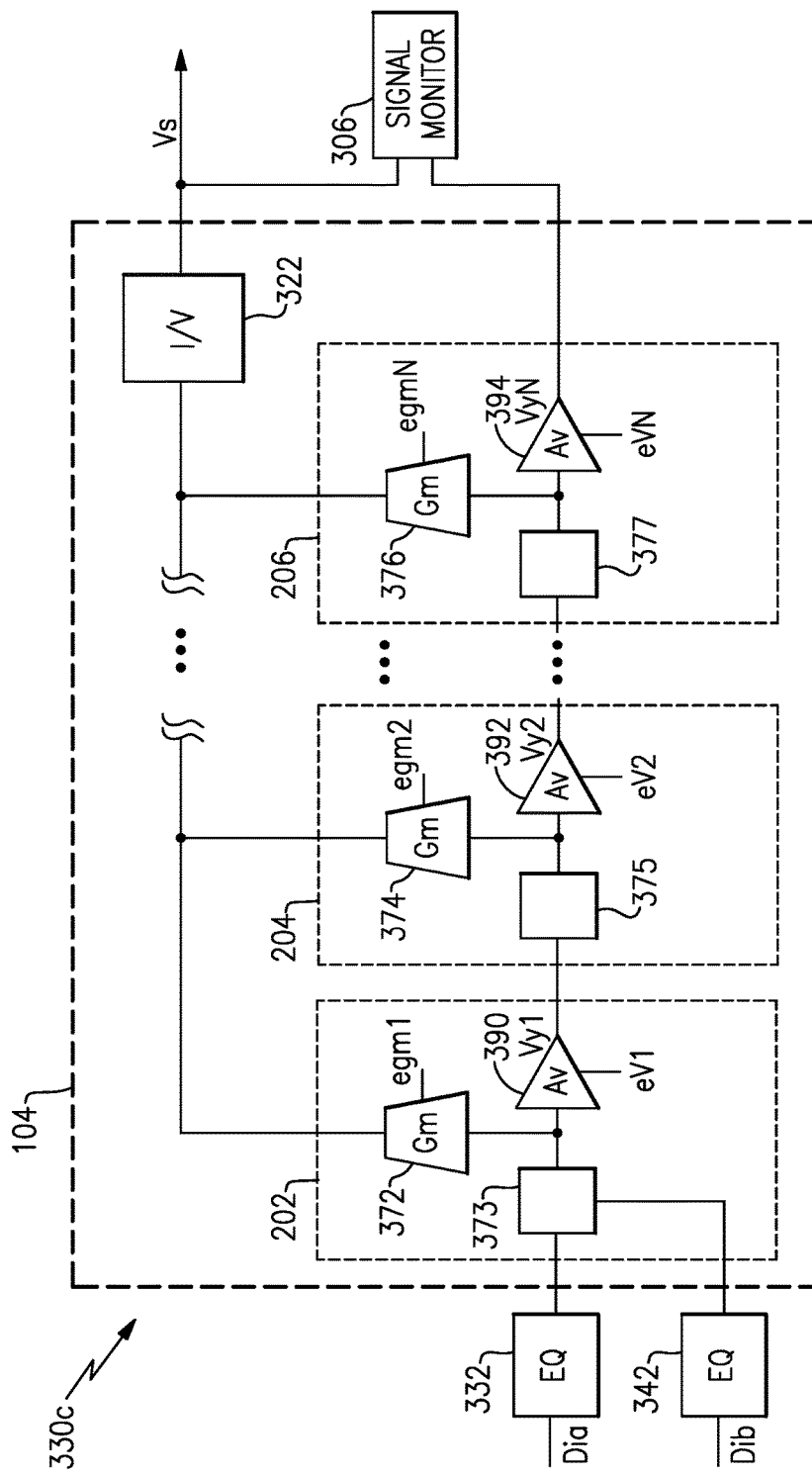
FIG. 3C is a detailed schematic diagram of a data receiver system with configurable multiple signal-processing stages according to an embodiment.

FIG. 3C is a detailed schematic diagram of a data receiver system 300c with configurable signal-processing stages according to an embodiment. The data receiver system 300c is similar to the data receiver systems 300a of FIG. 3A and 300b of FIG. 3B. Furthermore, the system 300c shows a realization where the Nth stages 202-206 within the data receiver system 300c have a modified signal flow topology as compared to those of the data receiver systems 300b and 300c.

In the first through Nth stages 202-206 of FIG. 3C, amplifier stages and transconductance stages are shown, as well as input stages. For instance, the first stage 202 includes an input stage 373, an amplifier stage 390, and a transconductance stage 372. The input stage 373 has a first and second input port connected to the output ports of the EQ 332 and 342, respectively. An output port of the input stage 373 is connected to an input port of the transconductance stage 372 and the amplifier stage 390. Similarly, the second stage 204 includes an input stage 375, an amplifier stage 392, and a transconductance stage 374. The input stage 375 has an input port connected to the output port of the previous stage 202 and an output port connected to an input port of the transconductance stage 374 and an input port of the amplifier stage 392. Successive stages can be constructed similarly, and also as shown in FIG. 3C, the Nth stage 206 includes an input stage 377, a transconductance stage 376, and an amplifier stage 394. The input stage 377 has an input port connected to an output port of a previous stage as indicated by the ellipses. Also, the input stage 377 can include an output port connected to an input port of the transconductance stage 376 and to an input port of the amplifier stage 394.

Similar to the stages of the first through Nth stages 202-206 of FIG. 3B, the stages of FIG. 3C are connected in cascade. In the illustrated embodiment, an output port of the amplifier stage 390 corresponds to the output port of the first stage 202, which connects to the input port of the stage 204. An output port of the amplifier stage 392 corresponds to the output port of the second stage 204, which connects to the input port of the successive stage indicated by the ellipses. Also, an output port of the amplifier 104 corresponds to the output port of the Nth stage 206 which connects to a second input port of the signal monitor 306.

Furthermore, the amplifier and transconductance stages of the first through Nth stages can receive the control signals eV1-eVN and/or egml-egmN, which can control the individual amplifier/transconductance stage to operate in an on/off state. For example, the amplifier stage 390 can receive the control signal egml and/or eV1, which can control whether the amplifier stage 390 is in an on/off state. Similarly, the transconductance stage 372 can receive the control signal egml and/or eV1, which can control whether the transconductance stage 372 is in an on/off state. It will be understood that each of the stages can receive fewer or more control signals as desired. For example, the amplifier stage 390 may only receive the control signal eV1 and/or may receive all of the control signals eV1-eVN and/or egml-egmN as desired.

Furthermore, the control signals can also be used to control the first through Nth stages 202-206 to operate in various states, such as, but not limited to a stage monitor state, a stage cascade stage, and/or a stage disable state. The description of operation can be similar to that presented above for the first through Nth stages 202-206 of FIGS. 3A and 3B.

Although the different gain stages 202, 204, 206 are illustrated as including input stages 373, 375, 377, transconductance stages 372, 374, 376, and amplifier stages 390, 392, 394, it will be understood that each stage can include fewer, more, or different components or stages. For example, rather than a transconductance stage and amplifier stage, the different gain stages 202, 204, 206, can include one or more other processing stages (or sub-stages) that process the signal. As described above with reference to the transconductance stages 372, 374, 376, and amplifier stages 390, 392, 394, the one or more processing sub-stages within the gain stages 202, 204, 206 can receive control signals (and include control circuitry), which can control whether the individual processing sub-stages are in an on/off state.

Figure 4A:
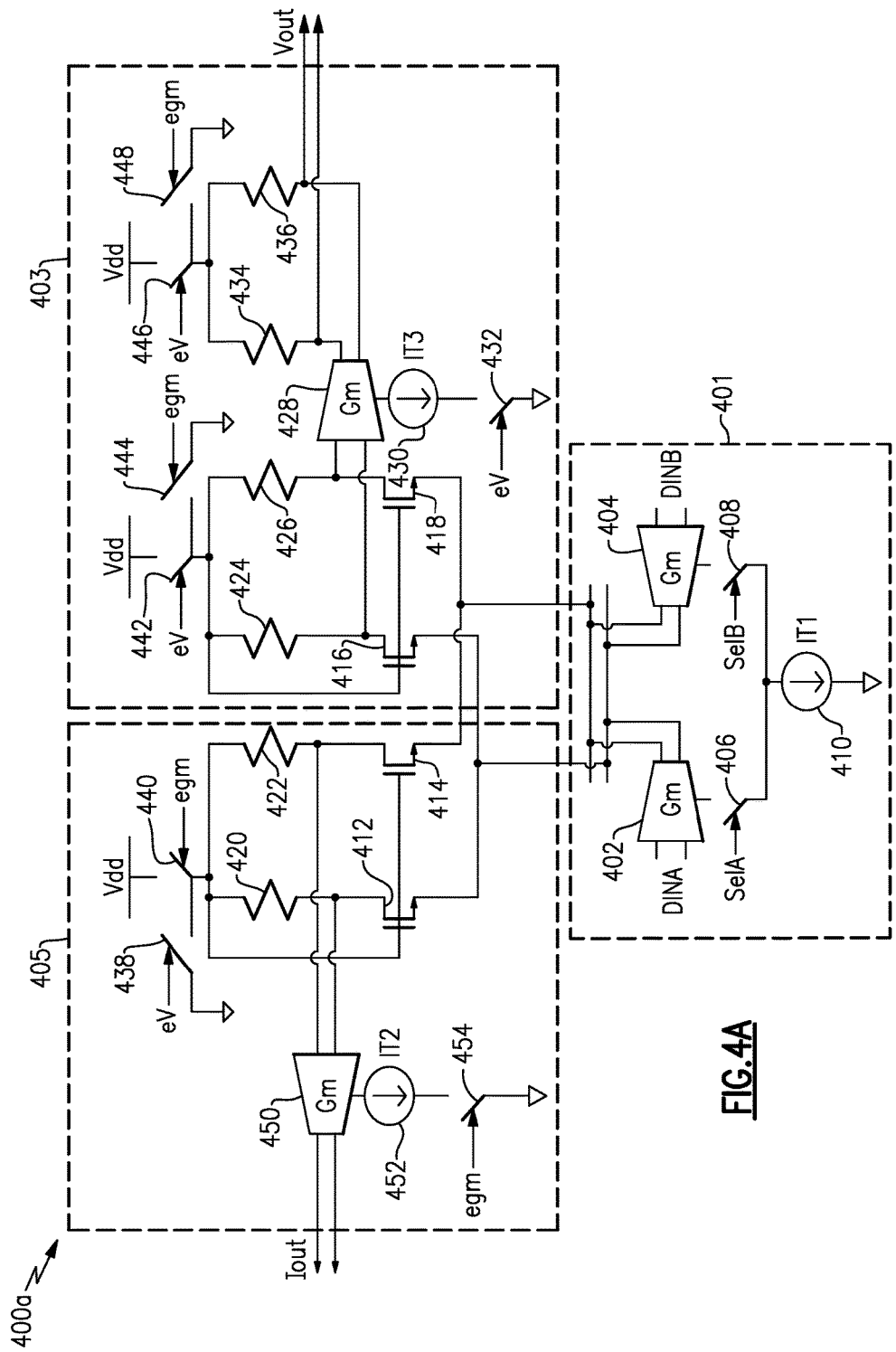
FIG. 4A is a schematic diagram of a configurable stage according to one embodiment.

FIG. 4A is a schematic diagram of a configurable stage 400a according to one embodiment. The configurable stage 400a can also be referred to more generally as a stage 400a and can represent a more detailed circuit representation of a stage from the first through Nth stages 202-206 of the previous figures. In the illustrated embodiment, the stage 400a includes an input stage 401, an amplifier stage 403, and a transconductance stage 405.

In the illustrated embodiment, the input stage 401 includes the transconductance (Gm) devices 402, 404, the switches 406, 408, and the current source 410; the amplifier stage 403 includes the transconductance device 428, the current source 430, the switches 432, 442, 444, 446, 448, the resistors 424, 426, 434, 436, and the transistors 416, 418; and the transconductance stage 405 includes the transconductance device 450, the current source 452, the switches 438, 440, 454, the resistors 420, 422, and the transistors 412, 414. It will be understood that the input stage 401, amplifier stage 403, and/or the transconductance stage 405 can include fewer or more components as desired. For example, one of the transconductance devices 402, 404 and corresponding switch 406, 408 can be omitted, fewer or more resistors, transistors, and/or transconductance devices can be used, as desired. In some embodiments, the Gm devices 402, 404, 428, 450 can be implemented using a differential pair, a folded cascade stage, and/or a differential stage, as desired. In some embodiments, the switches 406, 408, 432, 438, 440, 442, 444, 446, 448, 454 can be implemented using one or more transistors, such as BJTs, FETS, MOS devices, such as MOSFETS, such as NMOS (n-channel metal oxide semiconductor) and PMOS (p-channel metal oxide semiconductor) FETs, etc. In certain embodiments, the transistors 412, 416, 418 can be implemented using BJTs, FETS, MOS devices, such as MOSFETS, or other types of switches.

The Gm devices 402, 404, 428, and 450 each have a tail current port, a first and second input port, and a first and second output port. The switch 406 is connected between the tail current port of the Gm device 402 and a first terminal of the current source 410, and the switch 408 is connected between the tail current port of the Gm device 404 and the first terminal of the current source 410. A second terminal of the current source 410 is connected to ground. The first output port of the Gm device 402 is connected to the first output port of the Gm device 404, and the second output port of the Gm device 402 is connected to the second output port of the Gm device 404.

The transistor 412 is coupled to the second output port of the devices 402 and 404, the resistor 420, and the second terminal of the resistor 420. In certain embodiments, such as when the transistor is a MOSFET, the source can be coupled to the second output port of the Gm devices 402, 404, the drain can be connected to the first terminal of the resistor 420 and the gate can be coupled to the second terminal of the resistor 420. The transistor 414 has a source connected to the first output port of the Gm devices 402 and 404, a drain connected to the first terminal of the resistor 422, and a gate connected to the gate of the transistor 412. The transistor 416 can be coupled to the second output port of the Gm devices 402 and 404 and the resistor 424. In the illustrated embodiment, the transistor 416 has a source connected to the second output port of the Gm devices 402 and 404, a drain connected to a first terminal of the resistor 424, and a gate connected to the second terminal of the resistor 424. The transistor 418 can be coupled to the first output port of the Gm devices 402 and 404, the resistor 426, the transistor 416. In the illustrated embodiment, the transistor 418 has a source connected to the first output port of the Gm devices 402 and 404, a drain connected to the first terminal of the resistor 426, and a gate connected to the gate of the transistor 416. Additionally, the second terminal of the resistor 420 is connected to the second terminal of the resistor 422, and the second terminal of the resistor 424 is connected to the second terminal of the resistor 426.

A first terminal of the current source 430 is connected to the tail current port of the Gm device 428, and a second terminal of the current source 430 is connected to a first terminal of the switch 432. A second terminal of the switch 432 is connected to ground. The first and second input ports of the Gm device 428 can be coupled to the transistors 416, 430. In the illustrated embodiment, the first and second input ports of the Gm device 428 are connected to the drain of the transistor 430 and the drain of the transistor 416, respectively. The first output port of the Gm device 428 is connected to the first terminal of the resistor 434, and the second output port of the Gm device 428 is connected to the first terminal of the resistor 436. The second terminals of the resistors 436 and 438 are connected together.

A first terminal of the current source 452 is connected to the tail current port of the Gm device 450, and a second terminal of the current source 452 is connected to a first terminal of the switch 454. A second terminal of the switch 454 is connected to ground. The first and second input ports of the Gm device 450 can be coupled to the transistors 412, 414. In the illustrated embodiment, the first and second input ports of the Gm device 450 are connected to the drain of the transistor 414 and the drain of the transistor 412, respectively. The second terminals of the resistors 420 and 422 are connected together.

The switch 438 is connected between ground and the second terminal of the resistors 420 and 422. The switch 440 is connected between a supply Vdd and the second terminal of the resistors 420 and 422. Also, the switch 444 is connected between ground and the second terminal of the resistors 424 and 426; and the switch 442 is connected between the supply Vdd and the second terminal of the resistors 424 and 426. Additionally, the switch 448 is connected between ground and the second terminal of the resistors 434 and 436; and the switch 446 is connected between the supply Vdd and the second terminal of the resistors 434 and 436.

A differential data signal DINA is provided across the first and the second input ports of the Gm device 402, and a differential data signal DINB is provided across the first and the second input ports of the Gm device 404. The switch 406 and the switch 408 be used to determine which of the Gm devices functionally operates within the stage 400a. The switches 406 and 408 are shown to be controlled by a control signal Se1A and a control signal Se1B, respectively. When the control signal Se1A controls the switch 406 to close and to operate as a short while the control signal Se1B controls the switch 408 to open and to operate as an open circuit, the Gm device 402 receives a tail current IT1 from the current source 410. In this way the Gm device 402 can convert the differential data signal DINA to a differential cascode signal. The differential cascode signal appears across the first and the second output ports of the Gm device 402. Alternatively, if the control signals Se1A and Se1B control the switch 406 to open and the switch 408 to close, then the Gm device 404 receives the tail IT1 and converts the differential data signal DINB to a differential cascode signal to appear across the first and the second output ports of the Gm device 404.

The enable signal eV and the enable signal egm can be provided so as to control the stage 400a to operate in either a stage monitor state, a stage cascade state, or a stage blocking state. As shown in FIG. 4, the switches 432, 438, 442, and 446 receive and are controlled by the control signal eV, while the switches 440, 444, 448, and 454 receive and are controlled by the control signal egm.

The stage monitor state can be realized when the control signal egm controls the switches 440, 444, 448, and 454 to be closed. Furthermore, in some cases, to enter the stage monitor state, the control signal eV can control the switches 432, 438, 442, and 446 to be open as well. Under these conditions transistors 412-414 with resistors 420-422 can operate as an active cascode, which provides a first amplified differential cascode signal across the first and second input ports of the Gm device 450. The Gm device 450 receives a tail current IT2 and converts the first amplified differential cascode signal into a differential current signal Tout. The differential current signal Tout corresponds to the active output signal which is provided at the second output port of a stage such as the first through Nth stages 202-206 of FIGS. 2A-3B.

Also under the above described control conditions, the Gm device 428 receives no tail current while the first and the second input ports of the Gm device 428 are forced to ground potential by virtue of the signal path connection with the switch 444. Additionally, the first and the second output ports of the Gm device 428 are forced to ground potential by virtue of the signal path connection with the switch 448; therefore, by inspection the differential output voltage Vout across the first and the second output ports of the Gm device 428 is zero or null. In this way the Gm device 428 provides a null voltage, a null cascade output signal, at the first output port of a stage such as the first through Nth stages 202-208 of FIGS. 2A-3B.

The stage cascade state can be realized when the control signal egm controls the switches 440, 444, 448, and 454 to be open and the control signal eV controls the switches 432, 438, 442, and 446 to be closed. Under these conditions, transistors 416-418 with resistors 424-426 operate as an active cascode which provides a second amplified differential cascode signal across the first and second input ports of the Gm device 428. The Gm device 428 receives a tail current IT3 and converts the second amplified differential cascode signal into a second differential current signal. The second differential current signal is converted to a differential voltage signal Vout through the resistors 434 and 436. The differential voltage signal Vout corresponds to the cascade output signal which is provided at the first output port of a stage such as the first through Nth stages 202-206 of FIGS. 2A-3B. Also under the above described control conditions, the Gm device 450 receives no tail current while the first and the second input ports of the Gm device 450 are forced to ground by virtue of the signal path connection with the switch 438. By inspection the first and the second output ports of the Gm device 450 present high impedance. In this way the Gm device 450 provides a high impedance at the second output port of a stage such as the first through Nth stages 202-208 of FIG. 2A-3B.

The stage blocking state can be realized when the control signal egm controls the switches 440, 444, 448, and 454 to be open and the control signal eV controls the switches 432, 438, 442, and 446 to be open. Under these conditions the Gm device 428 provides a null voltage (Vout is zero) at the first output port and the Gm device 450 provides a high impedance at the second output port. This corresponds to providing a null cascade output signal at the first output port and to providing a high impedance at the second output port of a stage such as the first through Nth stages 202-208 of FIGS. 2A-3B.

Using the configurable stage 400a as part of a controllable and programmable multi-stage amplifier or limiting amplifier or other circuit, can offer additional advantages. For instance, the configurable stage 400a can offer a simplified RX design which in turn can reduce complexity and design time compared to using traditional amplifiers. In addition, cascading multiple configurable signal-processing stages can allow a wide gain range with small perturbations on a gain bandwidth product; thus, it can be easier to stabilize multiple signal-processing stages using the configurable stage 400 while adjusting gain.

Figure 4B:
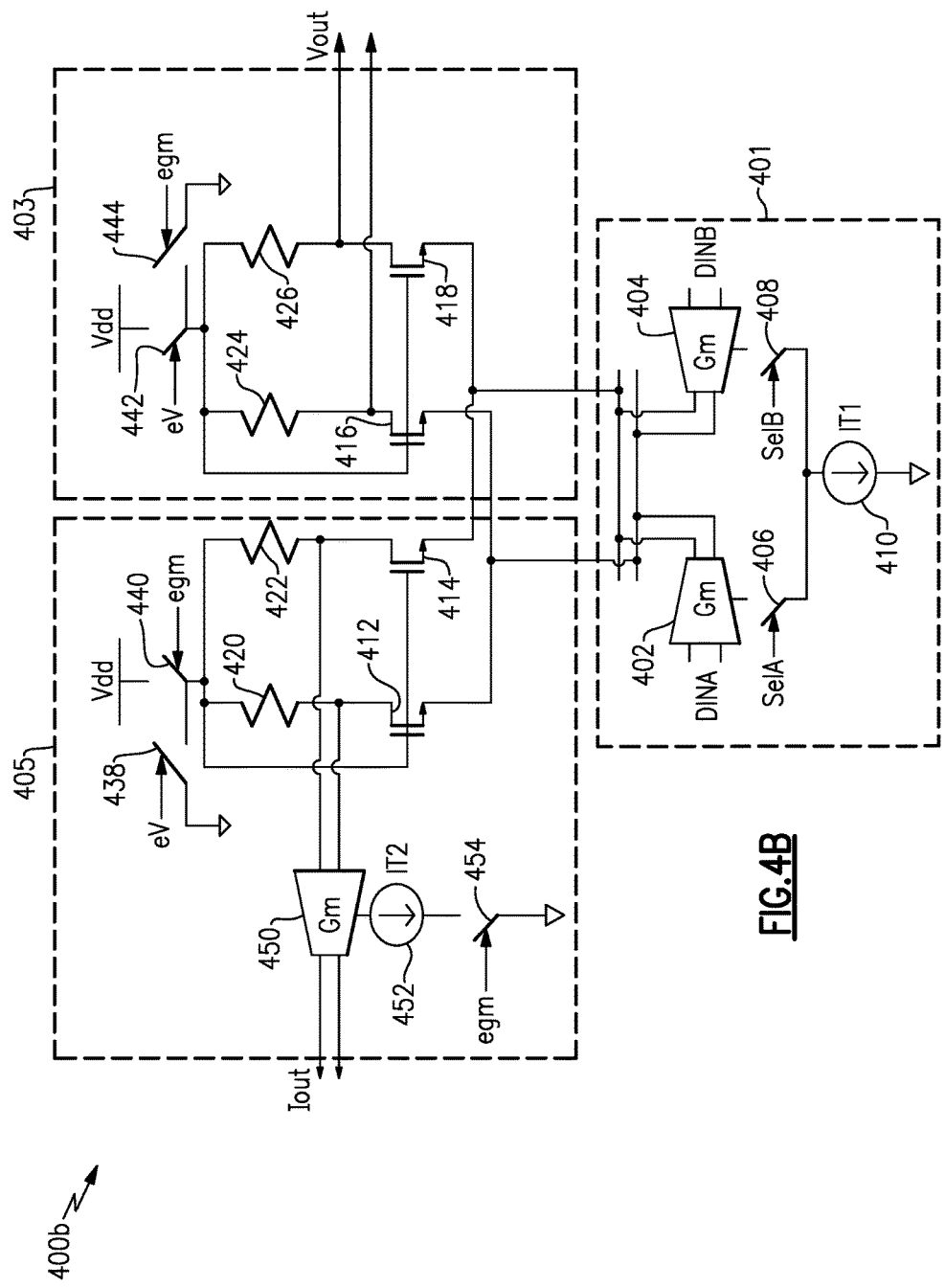
FIG. 4B is a schematic diagram of a configurable stage according to another embodiment.

FIG. 4B is a schematic diagram of a configurable stage 400b according to another embodiment. The configurable stage 400b is similar to the configurable stage 400a in some respects. By comparison to the configurable stage 400a, the configurable stage 400b provides the differential output voltage Vout across the drains of transistors 414 and 416 instead of at the output of a transconductance device 428.

Figure 4C:
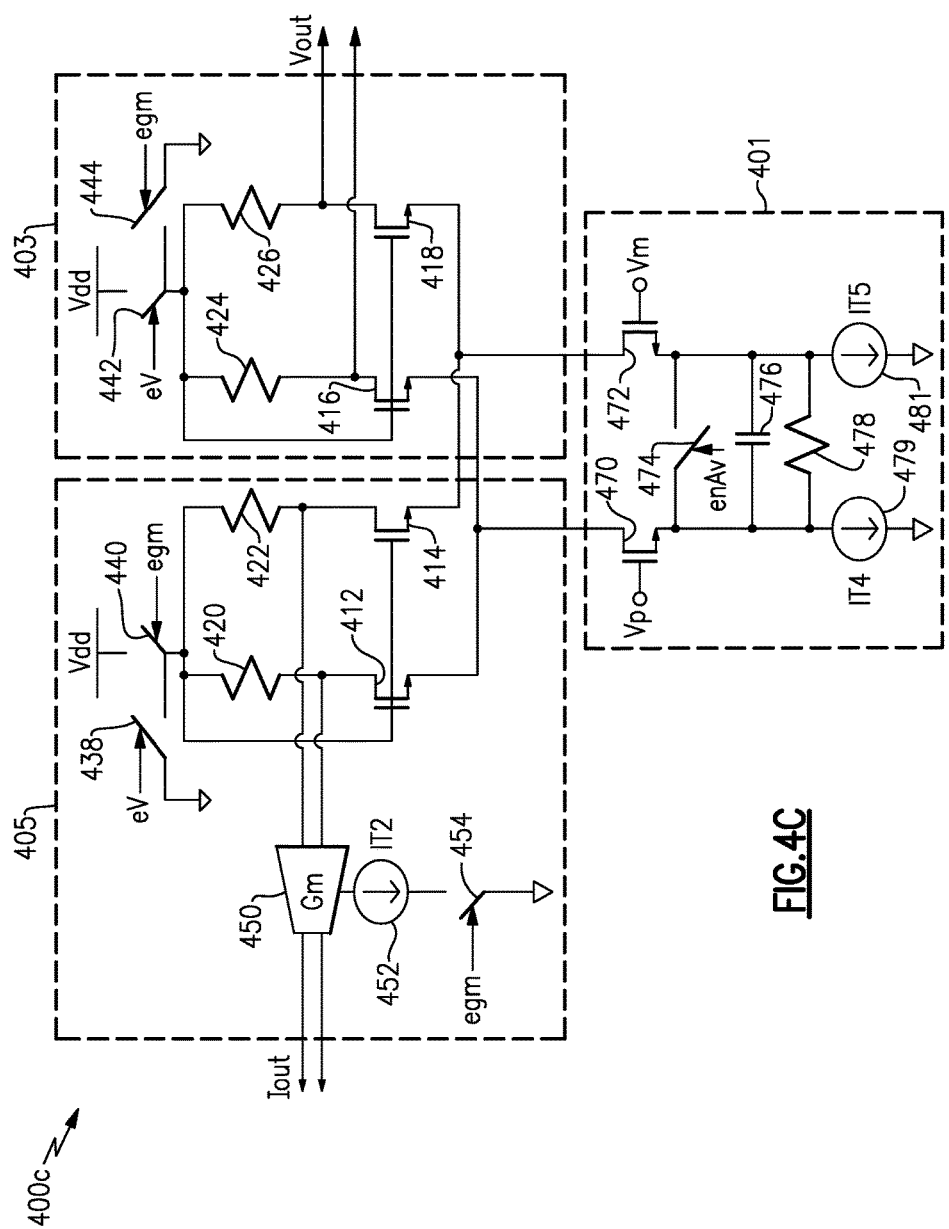
FIG. 4C is a schematic diagram of a configurable stage according to another embodiment.

FIG. 4C is a schematic diagram of a configurable stage 400c according to another embodiment. The configurable stage 400c is similar to the configurable stage 400b, except it can operate as an equalizer to equalize the differential input given by the difference of a noninverting signal Vp and and inverting signal Vn and to provide the equalized signal at the differential output Vout.

The configurable stage 400c is similar to the configurable stage 400b except instead of including transconductance devices 402 and 404 with the current source 410, it includes a transistor 470, a transistor 472, a capacitor 476, a resistor 478, a current source 479, a current source 481, and a switch 474.

The transistors 470, 472, with the current sources 479, 481, and with resistor 478 and capacitor 476 form a source degenerated differential pair which can have a frequency dependent transconductance gm. The values of the resistor 478 and the capacitor 476 can be selected to control the equalization of a differential signal determined by the difference of the noninverting signal Vp at the gate of the transistor 470 and the inverting signal Vn at the gate of the transistor 472.

The current source 479 provides tail current IT4 to the source degenerated transistor pair at the source of the transistor 470, and the current source 481 provides tail current IT5 to the source degenerated transistor pair at the source of the transistor 472.

The switch 474 is controlled by a control signal enAv to enable the configurable stage 400c to operate as a differential amplifier without degeneration when the switch 474 is closed. In this mode the operation of the configurable stage 400c is similar to that of 400b except with a single differential input signal determined by the difference of Vp and Vn. When the control signal enAv controls the switch 474 to be open, the configurable stage 400c operates as an equalizer allowing the equalized signal to either appear at the output of the Gm device 450 as the differential current output Tout or as a differential output voltage Vout at the output across the drains of transistors 414 and 416. The operation transferring the equalized signal to either Tout or Vout can be similar to the operation described for the configurable stage 400a, which is based upon the state of the control signals eV and egm.

Although the different configurable stages 400a, 400b, 400c are illustrated as input stage 401, an amplifier stage 403, and a transconductance stage 405, it will be understood that the configurable stages 400a, 400b, 400c can include fewer, more, or different components or stages. For example, rather than a transconductance stage 405 and amplifier stage 403, the configurable stages 400a, 400b, 400c, can include one or more other processing stages (or sub-stages) that process the signal. For instance, in some embodiments the transconductance stage 405 can be derived with fewer components or without the Gm device 450. For example, in certain embodiments, the differential current output Tout can be derived directly from the drains of transistors 412 and 414 allowing the Gm device 450, the current source 452, and the switch 454, to be excluded. In this way the transconductance stage 405 can comprise the transistors 412, 414 and the switches 438, 440 with the drains of the transistors 412, 414 providing the differential current output Tout. As described above with reference to the transconductance stage 405, and amplifier stage 403, the one or more processing sub-stages within the configurable stages 400a, 400b, 400c can include control circuitry, such as switches 438, 440, 442, 444, which can control whether the individual processing sub-stages are in an on/off state. When in an off state, the processing sub-stage can provide a null voltage and/or high impedance at the output port so as to not load the input port of another gain stage or signal monitor.

APPLICATIONS

Devices employing the above described adaptable receiver amplifiers can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A signal-processing apparatus comprising:
a plurality of cascaded stages, each stage configured to process an input signal and each stage comprising a first amplified output and a second amplified output that is amplified separately from the first amplified output, wherein the first amplified output of each stage is coupled to at least one of an input of a proximate stage or a receiving circuit, wherein the second amplified output of each stage is coupled to a selection circuit configured to output at least one of an output of a selected stage of the plurality of cascaded stages.

2. The signal-processing apparatus of claim 1, wherein the second amplified output of each of the plurality of cascaded stages other than the second amplified output of the selected stage is a high impedance output.

3. The signal-processing apparatus of claim 1, wherein, for each of the plurality of cascaded stages, at least one of the first amplified output or the second amplified output is a high impedance output.

4. The signal-processing apparatus of claim 1, wherein the first amplified output of the selected stage is a high impedance output.

5. The signal-processing apparatus of claim 1, wherein the selected stage is in a stage monitor state and one or more stages in a signal path preceding the selected stage are in a stage cascade state and one or more stages in a signal path following the selected stage are in a stage blocking state, and wherein in the stage blocking state, an output of the one or more stages in the signal path following the selected stage is a high impedance output.

6. The signal-processing apparatus of claim 1, wherein a first stage of the plurality of cascaded stages comprises:
an input stage;
an amplifier stage coupled to the first amplified output; and
a transconductance stage coupled to the second amplified output and having an input coupled to the input stage.

7. The signal-processing apparatus of claim 6, wherein the transconductance stage is configured to receive a voltage from the amplifier stage and the second amplified output outputs a current.

8. The signal-processing apparatus of claim 6, wherein the transconductance stage is configured to operate in either a transconductance-on state or a transconductance-off state, wherein in the transconductance-off state the second amplified output is a high impedance output.

9. The signal-processing apparatus of claim 8, wherein the transconductance stage comprises a cascode circuit and a transconductance device, wherein in the transconductance-off state the cascode circuit is coupled to a voltage low source and in the transconductance-on state the cascode circuit is coupled to a voltage high source and the transconductance device is coupled to a current source.

10. The signal-processing apparatus of claim 6, wherein the amplifier stage is configured to operate in either a stage-on state or a stage-off state, wherein in the stage-off state the first amplified output is a high impedance output.

11. The signal-processing apparatus of claim 10, wherein the amplifier stage comprises a cascode circuit and a transconductance device, wherein in the stage- off state the cascode circuit is coupled to a voltage low source and in the stage-on state the cascode circuit is coupled to a voltage high source and the transconductance device is coupled to a current source.

12. The signal-processing apparatus of claim 1, wherein the first amplified output of the selected stage is a high impedance output, wherein the second amplified output of the selected stage is not a high impedance output.

13. A first stage of a plurality of stages of a limiting amplifier, the first stage comprising:
an input stage;
an amplifier stage coupled to the input stage and to a first output of the first stage, wherein each stage of the plurality of stages includes a first output and a second output; and
a transconductance stage coupled to the input stage and to the second output of the first stage,
wherein a common bus is coupled to the second output of each of the plurality of stages,
wherein the first stage is configured to operate in a plurality of states based at least in part on a state of at least one of the amplifier stage or the transconductance stage.

14. The first stage of the limiting amplifier of claim 13, wherein the transconductance stage is configured to operate in either a transconductance-on state or a transconductance-off state, wherein in the transconductance-off state the second output is a high impedance output.

15. The first stage of the limiting amplifier of claim 13, wherein the amplifier stage is configured to operate in either a stage-on state or a stage-off state, wherein in the stage-off state the first stage output is a high impedance output.

16. The first stage of claim 13, wherein the common bus is further coupled to a receiving circuit configured to receive or monitor an output of a selected stage of the plurality stages.

17. A signal-processing apparatus comprising:
a plurality of cascaded stages, each stage of the plurality of cascaded stages comprising:
an input,
a first amplified output, and
a second amplified output that is amplified separately from the first amplified output,
wherein the second amplified output of each stage is coupled to a common bus,
wherein the second amplified output of a first cascaded stage of the plurality of cascaded stages provides an active output signal to the common bus and the second amplified output of a second cascaded stage of the plurality of cascaded stages concurrently provides a non-active output signal to the common bus,
wherein the first amplified output of each stage is coupled to at least one of a receiving circuit or the input of a proximate stage of the plurality of cascaded stages.

18. The signal-processing apparatus of claim 17, wherein each stage of the plurality of cascaded stages further comprises a transconductance stage coupled to the second amplified output.

19. The signal-processing apparatus of claim 17, wherein the common bus is coupled to the receiving circuit.

20. The signal-processing apparatus of claim 17, wherein only one of the plurality of second amplified outputs provides the active output signal to the common bus at a time.

21. A signal-processing apparatus comprising:
a plurality of cascaded stages, each stage of the plurality of cascaded stages comprising:
an input,
a first amplified output, and
a second amplified output that is amplified separately from the first amplified output,
wherein the second amplified output of each stage is coupled to a common bus,
wherein the first amplified output of each stage is coupled to at least one of a receiving circuit or the input of a proximate stage of the plurality of cascaded stages, the receiving circuit configured to receive an output of a selected stage of the plurality of cascaded stages.

22. The signal-processing apparatus of claim 21, wherein the first amplified output of the selected stage is a high impedance output.

23. The signal-processing apparatus of claim 21, wherein each of the plurality of second amplified outputs is a high impedance output other than the second amplified output of the selected stage.

24. A signal-processing apparatus comprising:
a plurality of cascaded stages, each stage of the plurality of cascaded stages comprising:
an input,
an amplifier stage,
a first amplified output coupled to the amplifier stage, and
a second amplified output that is amplified separately from the first amplified output,
wherein the second amplified output of each stage is coupled to a common bus,
wherein at least one of the second amplified outputs provides a non-active signal to the common bus,
wherein the first amplified output of each stage is coupled to at least one of a receiving circuit or the input of a proximate stage of the plurality of cascaded stages.

* * * * *